(12) United States Patent  
Cohen et al.

(10) Patent No.: US 8,927,968 B2  
(45) Date of Patent: Jan. 6, 2015

(54) ACCURATE CONTROL OF DISTANCE BETWEEN SUSPENDED SEMICONDUCTOR NANOWIRES AND SUBSTRATE SURFACE

(71) Applicant: International Business Machines Corporation, Armonk, NY (US)

(72) Inventors: Guy Cohen, Mohegan Lake, NY (US); Michael A. Guillorn, Yorktown Heights, NY (US); Alfred Grill, White Plains, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/010,060

(22) Filed: Aug. 26, 2013

(65) Prior Publication Data

US 2014/0166983 A1  Jun. 19, 2014

Related U.S. Application Data

(63) Continuation of application No. 13/718,767, filed on Dec. 18, 2012.

(51) Int. Cl.
*H01L 29/775* (2006.01)
*H01L 29/66* (2006.01)
(Continued)

(52) U.S. Cl.
CPC ............... *H01L 29/775* (2013.01); *B82Y 40/00* (2013.01); *H01L 29/66484* (2013.01)
(Continued)

(58) Field of Classification Search
CPC .. B82Y 10/00; B82Y 40/00; H01L 21/02488; H01L 21/02532; H01L 21/02603; H01L 21/0262; H01L 21/02639; H01L 21/02667; H01L 29/0665; H01L 29/0673; H01L 29/66439; H01L 29/775; H01L 29/42392; H01L 29/66484; H01L 29/785; H01L 29/78696; Y10S 977/762; Y10S 977/888; Y10S 977/938
USPC ...................................................... 257/39, 29
See application file for complete search history.

(56) References Cited

U.S. PATENT DOCUMENTS 7,176,126 B2 *  2/2007  Oh et al. ....................... 438/638
7,598,168 B2  10/2009  Han et al.
(Continued)

OTHER PUBLICATIONS

Ashcroft, N. W., et al., Solid State Physics, chapter 4, Jan. 2, 1976.
(Continued)

*Primary Examiner* — Tom Thomas
*Assistant Examiner* — Benjamin Tzu-Hung Liu
(74) *Attorney, Agent, or Firm* — Scully, Scott, Murphy & Presser, P.C.; Louis J. Percello, Esq.

(57) ABSTRACT

A method of forming a semiconductor device is provided. The method includes providing a structure including, a handle substrate, a buried boron nitride layer located above an uppermost surface of the handle substrate, a buried oxide layer located on an uppermost surface of the buried boron nitride layer, and a top semiconductor layer located on an uppermost surface of the buried oxide layer. Next, a first semiconductor pad, a second semiconductor pad and a plurality of semiconductor nanowires connecting the first semiconductor pad and the second semiconductor pad in a ladder-like configuration are patterned into the top semiconductor layer. The semiconductor nanowires are suspended by removing a portion of the buried oxide layer from beneath each semiconductor nanowire, wherein a portion of the uppermost surface of the buried boron nitride layer is exposed. Next, a gate all-around field effect transistor is formed.

14 Claims, 6 Drawing Sheets

(51) Int. Cl.
*H01L 29/06* (2006.01)
*H01L 29/786* (2006.01)
*H01L 29/78* (2006.01)
*H01L 29/423* (2006.01)
*B82Y 40/00* (2011.01)

(52) U.S. Cl.
CPC ..... *H01L 29/0673* (2013.01); *H01L 29/78696* (2013.01); *Y10S 977/938* (2013.01); *H01L 29/785* (2013.01); *Y10S 977/888* (2013.01); *H01L 29/42392* (2013.01); *Y10S 977/762* (2013.01)
USPC ............... 257/29; 977/762; 257/39; 977/938; 977/888

(56) References Cited

U.S. PATENT DOCUMENTS 7,884,004 B2 * 2/2011 Bangsaruntip et al. ....... 438/586
2004/0058199 A1 * 3/2004 Sakamoto et al. ........... 428/698

OTHER PUBLICATIONS

Office Action dated Jun. 4, 2014 received in the parent U.S. Patent Application, namely U.S. Appl. No. 13/718,767.

* cited by examiner

ACCURATE CONTROL OF DISTANCE BETWEEN SUSPENDED SEMICONDUCTOR NANOWIRES AND SUBSTRATE SURFACE

CROSS REFERENCE TO RELATED APPLICATION

This application is a continuation of U.S. patent application Ser. No. 13/718,767 filed Dec. 18, 2012 the entire content and disclosure of which is incorporated herein by reference.

BACKGROUND

The present disclosure relates to semiconductor-based electronic devices, and more particularly, to a gate-all around semiconductor nanowire field effect transistor (FET) and a method of forming the same.

The use of non-planar semiconductor devices such as, for example, FinFETs, trigate and gate-all around semiconductor nanowire field effect transistors (FETs) is the next step in the evolution of complementary metal oxide semiconductor (CMOS) devices. Fabrication of such non-planar semiconductor devices with minimal variation in the device region is critical to obtain devices with uniform electrical characteristics.

SUMMARY

The present disclosure provides a method to suspend semiconductor nanowires in a manner in which the vertical distance between each of the suspended semiconductor nanowires and the substrate surface is well controlled and independent of the dimension of the semiconductor nanowires. This is achieved in the present disclosure by utilizing a substrate which includes a buried boron nitride layer located immediately beneath a buried oxide layer. The buried boron nitride layer is more etch resistant as compared to the buried oxide layer of a traditional semiconductor-on-insulator (SOI) substrate. As such, a constant vertical distance between a central portion of each suspended semiconductor nanowire and the substrate surface, i.e., a portion of the uppermost surface of the buried boron nitride layer, can be achieved.

In one aspect of the present disclosure, a method of forming a semiconductor device is provided. The method of the present disclosure includes providing a structure comprising, from bottom to top, a handle substrate, a buried boron nitride layer located above an uppermost surface of the handle substrate, a buried oxide layer located on an uppermost surface of the buried boron nitride layer, and a top semiconductor layer located on an uppermost surface of the buried oxide layer. Next, a first semiconductor pad, a second semiconductor pad and a plurality of semiconductor nanowires connecting the first semiconductor pad and the second semiconductor pad in a ladder-like configuration are patterned into the top semiconductor layer. Each semiconductor nanowire of the plurality of semiconductor nanowires is suspended by removing a portion of the buried oxide layer from beneath each semiconductor nanowire, wherein a portion of the uppermost surface of the buried boron nitride layer is exposed. Next, a gate all-around field effect transistor, including a gate dielectric and a gate surrounding each semiconductor nanowire, is formed.

In another aspect of the present disclosure, a semiconductor device is provided. The semiconductor device includes a first buried oxide layer portion and a second buried oxide layer portion each located on an uppermost surface of a buried boron nitride layer, wherein a portion of the uppermost surface of the buried boron nitride layer between the first and second buried oxide layer portions is exposed. The device further includes a first semiconductor pad located atop the first buried oxide layer portion, and a second semiconductor pad located atop the second buried oxide layer portion. A plurality of semiconductor nanowires is also present connecting the first semiconductor pad and the second semiconductor pad in a ladder-like configuration and suspended above the exposed portion of the uppermost surface of the buried boron nitride layer.

DETAILED DESCRIPTION

The present disclosure, which provides a gate-all around semiconductor nanowire FET and a method of forming the same, will now be described in greater detail by referring to the following discussion and drawings that accompany the present disclosure. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. When an element is referred to as being "directly contacting" or "in direct contact with" another element, there are no intervening elements present.

As stated above, a method to suspend semiconductor nanowires in a manner in which the vertical distance between each of the suspended semiconductor nanowires and the substrate surface is well controlled and independent of the dimension of the semiconductor nanowires is provided. This is achieved in the present disclosure by utilizing a substrate which includes a buried boron nitride layer located immediately beneath a buried oxide layer. The buried boron nitride layer is more etch resistant as compared to the buried oxide layer of a traditional semiconductor-on-insulator (SOI) substrate. As such, a constant vertical distance between a central portion of each suspended semiconductor nanowire and the substrate surface, i.e., a portion of the uppermost surface of the buried boron nitride layer, can be achieved.

Figure 1A:
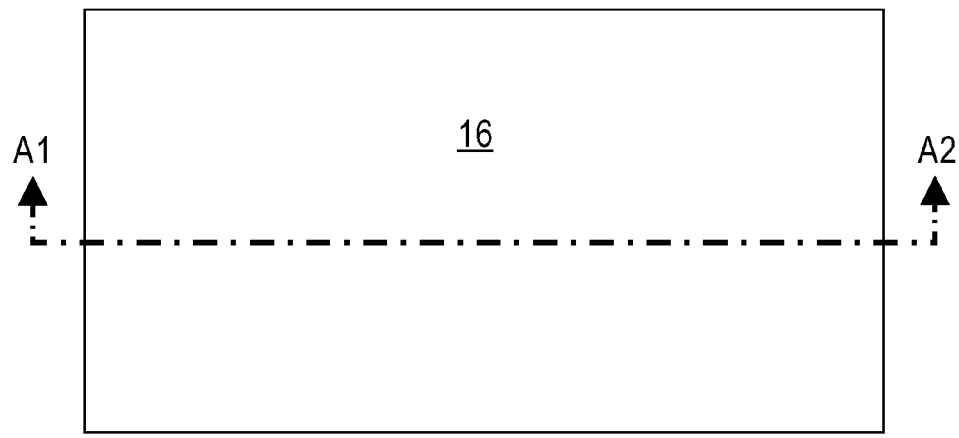
FIG. 1A is a top-down view of an exemplary semiconductor structure which includes, from bottom to top, a handle substrate, a buried boron nitride layer, a buried oxide layer, and a top semiconductor layer according to an embodiment of the present disclosure.
Figure 1B:
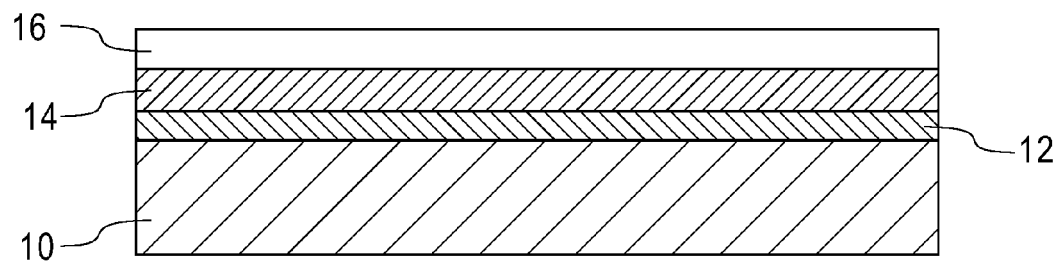
FIG. 1B is a vertical cross-sectional view of the exemplary semiconductor structure along the plane A1-A2 in FIG. 1A.

Referring first to FIGS. 1A-1B, there are illustrated an exemplary semiconductor structure which can be employed in one embodiment of the present disclosure. The exemplary semiconductor structure shown in FIGS. 1A-1B includes, from bottom to top, a handle substrate 10, a buried boron nitride layer 12, a buried oxide layer 14, and a top semiconductor layer 16. At this point of the present disclosure, the handle substrate 10, the buried boron nitride layer 12, the buried oxide layer 14 and the top semiconductor layer 16 are each contiguous layers having a planar uppermost surface.

The handle substrate 10 of the exemplary semiconductor structure has two functions: (i) The handle substrate 10 provides mechanical support, and (ii) the handle substrate 10 provides a low thermal resistance path for cooling (if cooling is needed). The handle substrate 10 thus may include any material that satisfies the above conditions. In one embodiment of the present disclosure, the handle substrate 10 includes a first semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present disclosure, the material of the handle substrate 10 can be a single crystalline, i.e., epitaxial, semiconductor material. The term "single crystalline" as used throughout the present disclosure denotes a material in which the crystal lattice of the entire sample is continuous and unbroken to the edges of the sample, with no grain boundaries. In one example, the handle substrate 10 can be a single crystalline silicon material. In some embodiments, the handle substrate 10 is a non-semiconductor material including, for example, a dielectric material and/or a conductive material.

Figure 2:
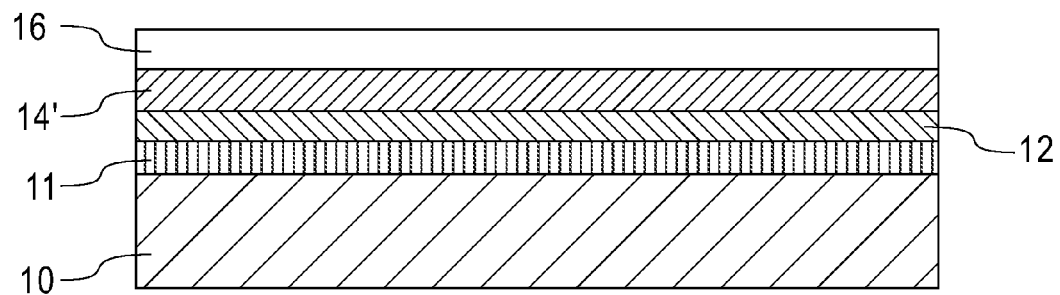
FIG. 2 is a vertical cross-sectional view of another exemplary semiconductor structure which includes, from bottom to top, a handle substrate, a first buried oxide layer, a buried boron nitride layer, a second buried oxide layer, and a top semiconductor layer according to an embodiment of the present disclosure.

All or portions of the handle substrate 10 can be doped to provide at least one globally or locally conductive region (not shown) located beneath the interface between the handle substrate 10 and the layer immediately overlying the handle substrate 10, i.e. buried boron nitride layer 12 or another buried oxide layer 11 as is shown in FIG. 2. The thickness of the handle substrate 10 can be from 50 microns to 1 mm, although lesser and greater thicknesses can also be employed.

In this embodiment of the present disclosure, the buried boron nitride layer 12 is located on an exposed uppermost surface of the handle substrate 10. The term "boron nitride" as used throughout the present disclosure denotes a chemical compound with the chemical formula BN. In some embodiments, the ratio of boron to nitride in the boron nitride layer 12 is 1 plus or minus 10%. In other embodiments of the present disclosure, the boron nitride consists of equal numbers of boron and nitrogen atoms. BN is isoelectronic to a similarly structured carbon lattice and thus it can exist in various forms. In one embodiment of the present disclosure, amorphous boron nitride (a-BN) can be employed as the buried boron nitride layer 12. In a further embodiment, an amorphous hydrogenated boron nitride can be employed boron nitride layer 12. In another embodiment of the present disclosure, the buried boron nitride layer 12 includes boron nitride that is in a hexagonal form. In another embodiment of the present disclosure, the buried boron nitride layer 12 includes boron nitride that is in a cubic form.

The buried boron nitride layer 12 that is employed in the present disclosure has a dielectric constant, which can be less than 7.0. In one embodiment of the present disclosure, the buried boron nitride layer 12 has a dielectric constant of from 4.0 to 5.5. The thickness of the buried boron nitride layer 12 can be from 10 nm to 200 nm, although lesser and greater thicknesses can also be employed.

The buried boron nitride layer 12 that is employed in the present disclosure has a good selectivity for wet etches. In one embodiment of the present disclosure, the buried boron nitride layer 12 has an etch selectivity of from 25 to 65 in a 100:1 diluted hydrofluoric acid (DHF) etchant (at room temperature) as compared to a thermal oxide. It should be noted that this ratio could vary depending on the type of boron nitride and oxide employed. In another embodiment of the present disclosure, the buried boron nitride layer 12 has an etch selectivity of from 4.4 to 6.8 in hot (180° C.) phosphoric acid as compared to silicon nitride. The aforementioned ratio may also vary.

The buried boron nitride layer 12 that is employed in the present disclosure also has a good selectivity for dry etches. In some embodiments, the buried boron nitride layer 12 has a good plasma resistance. By "good plasma resistance" it is meant that the material can withstand plasma bombardment without a significant loss of material. In some embodiments of the present disclosure, the buried boron nitride layer 12 can be tuned to achieve a much lower etch rate in comparison with the etch rates of other dielectrics, e.g., silicon dioxide or silicon nitride, by optimizing the associated reactive ion etching process.

In the embodiment that is illustrated in FIGS. 1A-1B, the buried oxide layer 14 is located on an uppermost surface of the buried boron nitride layer 12. The buried oxide layer 14 is an insulator layer that is comprised of a semiconductor oxide. In one embodiment of the present disclosure, the buried oxide layer 14 is comprised of silicon dioxide. The thickness of the buried oxide layer 14 can be from 2 nm to 200 nm, although lesser and greater thicknesses can also be employed.

The top semiconductor layer 16 of the exemplary structure shown in FIGS. 1A-1B includes a semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present disclosure, the semiconductor material of the top semiconductor layer 16 can be a single crystalline semiconductor material. In one example, the semiconductor material of the top semiconductor layer 16 can be a single crystalline silicon material. In one embodiment, the semiconductor material of the top semiconductor layer 16 may be comprised of a same semiconductor material as that of the handle substrate 10. In another embodiment, the semiconductor material of the top semiconductor layer 16 may be comprised of a different semiconductor material as that of the handle substrate 10. In one embodiment, the thickness of the top semiconductor layer 16 can be from 4 nm to 200 nm.

In some embodiments in which the top semiconductor layer 16 has a thickness that is outside the above mentioned range, the top semiconductor layer 16 can be thinned to a desired thickness by planarization, grinding, wet etching, dry etching, oxidation followed by oxide etching, or any combination thereof. One method of thinning the top semiconductor layer 16 is to oxidize the semiconductor material, such as silicon, by a thermal dry or wet oxidation process, and then wet etch the semiconductor oxide layer, such as silicon dioxide, using a hydrofluoric (HF) acid mixture. This process can be repeated to achieve the desired thickness of the top semiconductor layer 16.

All or portions of the top semiconductor layer 16 can be doped to provide at least one globally or locally conductive region (not shown). The dopant concentration in doped regions of the top semiconductor layer 16 can be optimized for device performance.

The exemplary semiconductor structure shown in FIGS. 1A-1B can be formed by utilizing any well known wafer bonding technique. In one embodiment, a first wafer including the top semiconductor layer 16 and the buried oxide layer 14 can be bonded to a second wafer including the handle substrate 10, and the buried boron nitride layer 12. Other bonding schemes are possible provided that the selected bonding scheme provides the exemplary semiconductor structure shown in FIGS. 1A-1B of the present disclosure.

Notwithstanding the bonding scheme that is selected, the buried boron nitride layer 12 can be formed by deposition including, but not limited to, CVD, PECVD, atomic layer deposition (ALD) and plasma enhanced atomic layer deposition (PE_ALD). In some embodiments of the present disclosure, the buried boron nitride layer 12 can be deposited from a single boron nitride precursor. In other embodiments of the present disclosure, the buried boron nitride layer 12 can be deposited from multiple boron nitride precursors. Illustrative examples of boron nitride precursors that can be employed include, but are not limited to, diborane and ammonia and/or nitrogen ($B_2H_6$+$NH_3$/$N_2$), trialkylamine boranes (such as, for example, triethylamine borane) and ammonia and/or nitrogen, and borazine (($BN)_3(NH_3)$=$B_3N_3H_6$) with optional $N_2$ or $NH_3$.

Reference is now made to FIG. 2 which illustrates another exemplary semiconductor structure that can be employed in the present disclosure. The exemplary structure shown in FIG. 2 is similar to the exemplary semiconductor structure shown in FIGS. 1A-1B except that another buried oxide layer is positioned between the handle substrate 10 and the buried boron nitride layer 12. Specifically, the exemplary structure shown in FIG. 2 includes from bottom to top, a handle substrate 10, a first buried oxide layer 11, a buried boron nitride layer 12, a second buried oxide layer 14', and a top semiconductor layer 16.

In this exemplary semiconductor structure, the handle substrate 10, the buried boron nitride layer 12 and the top semiconductor layer 16 are the same as that described above in connection with the exemplary semiconductor structure illustrated in FIGS. 1A-1B of the present disclosure. Also, the second buried oxide layer 14' is equivalent to the buried oxide layer 14 described above in connection with the exemplary semiconductor structure illustrated in FIGS. 1A-1B of the present disclosure.

The first buried oxide layer 11, which is positioned between the handle substrate 10 and the buried boron nitride layer 12, is an insulator layer that is comprised of a semiconductor oxide. In one embodiment of the present disclosure, the semiconductor oxide of the first buried oxide layer 11 is the same as the semiconductor oxide of the second buried oxide layer 14'. In another embodiment of the present disclosure, the semiconductor oxide of the first buried oxide layer 11 is different from the semiconductor oxide of the second buried oxide layer 14'. In one embodiment of the present disclosure, the first buried oxide layer 11 is comprised of silicon dioxide. In some embodiments of the present disclosure, the thickness of the first buried oxide layer 11 can be from 2 nm to 50 nm.

The exemplary semiconductor structure shown in FIG. 2 can be formed by utilizing any well known wafer bonding technique using any bonding scheme which is capable of providing the exemplary semiconductor structure shown in FIG. 2 of the present disclosure.

Figure 3:
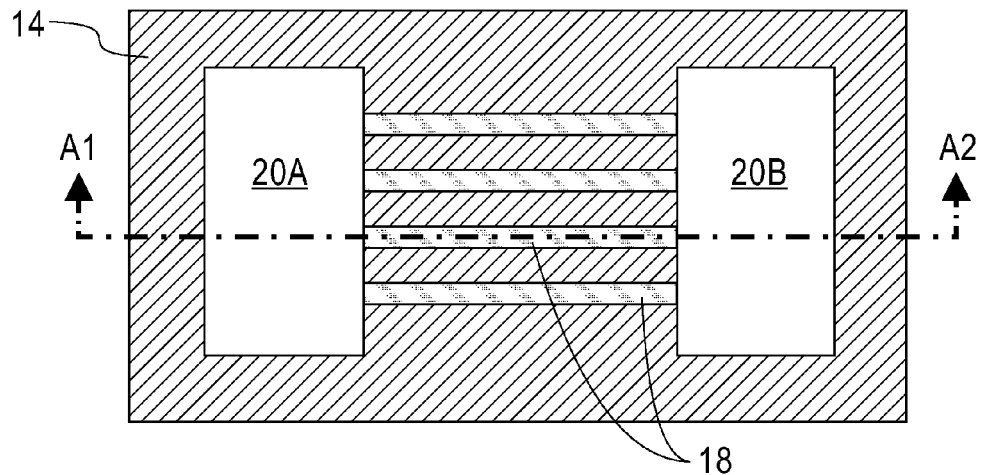
FIG. 3 is a top-down view of the exemplary semiconductor structure of FIG. 1A after formation of a plurality of semiconductor nanowires according to an embodiment of the present disclosure.

Referring now to FIG. 3, there is illustrated the exemplary semiconductor structure of FIGS. 1A-1B after formation of a plurality of semiconductor nanowires 18, which are arranged in a ladder like structure. Although the following description describes and illustrates using the exemplary semiconductor structure shown in FIGS. 1A-1B, the same processing steps can be performed using the exemplary semiconductor structure shown in FIG. 2, while achieving the same results.

Each semiconductor nanowire 18 that is formed has an end segment that is connected to a first semiconductor pad region 20A and another end segment that is connected to a second semiconductor pad region 20B. At this point of the present disclosure, the bottommost surface of each semiconductor nanowire is 'pinned' to an uppermost surface of the buried oxide layer 14. By "pinned" it is meant that the bottommost surface of each semiconductor nanowire 18 is still in direct physical contact with the uppermost surface of the buried oxide layer 14. The semiconductor nanowires 18, the first semiconductor pad region 20A and the second semiconductor pad region 20B are comprised of the same semiconductor material as the top semiconductor layer 16.

The structure shown in FIG. 3 can be formed by patterning the top semiconductor layer 16 utilizing lithography, followed by an etch process such as, for example, reactive ion etching (RIE). Prior to performing the lithography step a hard mask material (not shown) can optionally be formed on the top semiconductor layer 16 utilizing conventional techniques well known to those skilled in the art. For example, chemical vapor deposition, plasma enhanced chemical vapor deposition, or thermal growth can be used to form the hard mask material. In one embodiment, the hard mask material that can be employed includes, but is not limited to, an oxide, nitride, and/or oxynitride.

The lithographic step can include forming a photoresist above the top semiconductor layer 16, exposing the photoresist to a desired pattern of radiation and then developing the exposed photoresist or unexposed photoresist utilizing a conventional resist developer. The etch process that is employed in the present disclosure is selective so it preferentially removes exposed portions of the top semiconductor layer 16 but not the underlying buried oxide layer 14. If a hard mask is present, a separate etch or the same etch that is used in removing the exposed portions of the top semiconductor layer 16 can be used. After etching the hard mask can be referred to as a patterned hard mask. In some embodiments, a reactive ion etch utilizing hydrogen bromide (HBr) can be employed. Typically, but not necessarily always, a slab comprising a portion of the top semiconductor layer and optionally the patterned mask is first formed (by lithography and etching) and a second sequence of lithography and etching is used to pattern the slab into the structure shown in FIG. 3.

At this point of the present disclosure, the exposed surfaces, typically the sidewall surfaces and optionally the uppermost surface, of each semiconductor nanowire 18, have a first roughness. The roughness is not a desirable feature, and in most cases should be minimized. The line edge roughness of the resist and etch process are typically the main contributors to the sidewall roughness. In one embodiment, the first roughness of the exposed surfaces of each semiconductor nanowire 18, expressed in terms of a root mean squared roughness, is from 0.5 nm to 5 nm. In another embodiment, the first roughness of the exposed surfaces of each semiconductor nanowire 18, expressed in terms of a root mean squared roughness, is from 0.7 nm to 2.0 nm.

In one embodiment of the present disclosure and for tight pitch devices, the pitch (p), i.e., distance from a middle portion of one semiconductor nanowire to a middle portion of its nearest neighboring semiconductor nanowire, is from 5 nm to 70 nm. In another embodiment of the present disclosure and for tight pitch devices, the pitch (p) is from 20 nm to 40 nm. Other pitches that are greater than the ranges provided above can be obtained in the present disclosure. In some embodiments, the pitch between each semiconductor nanowire 18 is constant. In another embodiment, the pitch between each semiconductor nanowire 18 can vary.

The width of each of the semiconductor nanowires 18, which can be referred to herein as a first width, that is formed at this point of the present disclosure can vary depending on the process conditions used in fabricating the same. In one embodiment, the first width of each semiconductor nanowire 18 is from 3 nm to 50 nm. In another embodiment, the first width of each semiconductor nanowire 18 is from 5 nm to 22 nm.

Figure 4A:
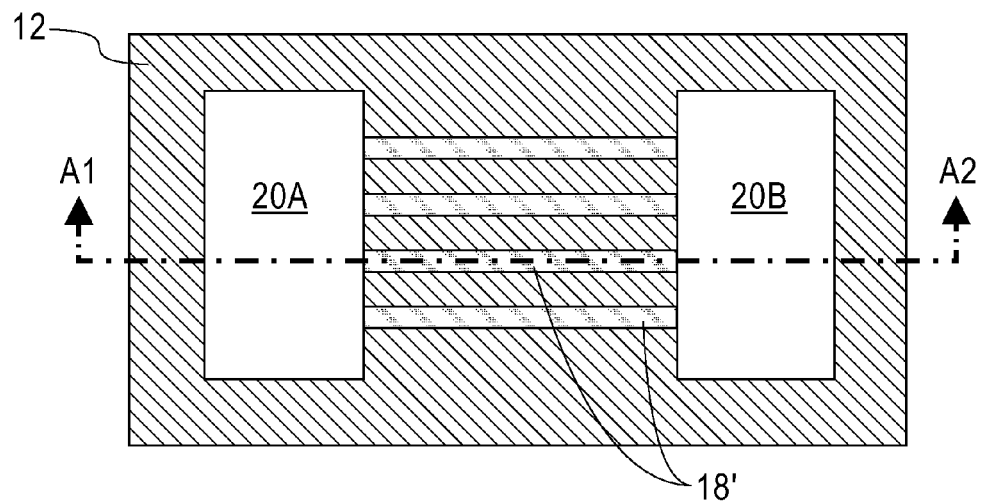
FIG. 4A is a top-down view of the exemplary semiconductor structure of FIG. 3 after formation of a plurality of suspended semiconductor nanowires according to an embodiment of the present disclosure.
Figure 4B:
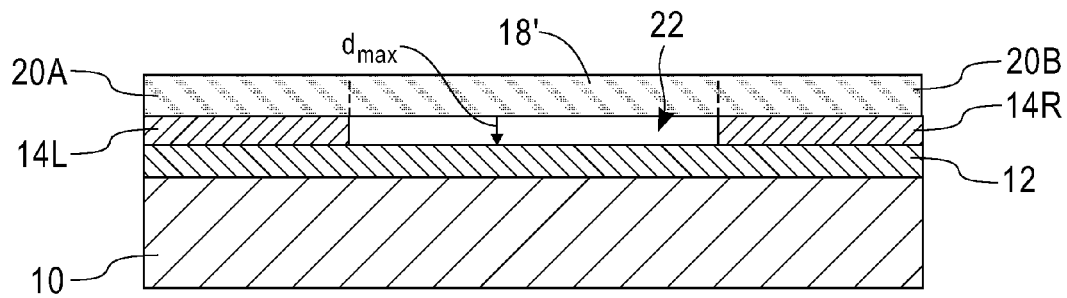
FIG. 4B is a vertical cross-sectional view of the exemplary semiconductor structure along the plane A1-A2 in FIG. 4A.

Referring now to FIGS. 4A-4B, there are illustrated the exemplary semiconductor structure of FIG. 3 after formation of a plurality of suspended, i.e., unpinned, semiconductor nanowires 18'. The term "suspended" as used throughout the present disclosure denotes that each of the semiconductor nanowires 18 are released from buried oxide layer 14 to provide a bridge comprised of semiconductor nanowires 18' spanning from the first semiconductor pad region 20A to the second semiconductor pad region 20B with the bottommost surface of each suspended semiconductor nanowire 18' being unpinned (i.e., not in direct physical contact) with the uppermost surface of the buried oxide layer 14. As is shown in the drawings, and after suspending the semiconductor nanowires, the first semiconductor pad 20A is located atop a first buried oxide layer portion 14L, and the second semiconductor pad 20B is located atop a second buried oxide layer portion 14R.

The suspending of the plurality of semiconductor nanowires 18 that are pinned to the uppermost surface of the buried oxide layer 14 is performed by recessing a portion of the buried oxide layer 14 that lies underneath each of the semiconductor nanowires 18. In FIG. 4B, reference numeral 22 denotes the recessed region that is formed. In some embodiments of the present disclosure, patterned hard mask, if present, can be removed during this step of the present disclosure. In another embodiment, the patterned hard mask, if present, can be removed prior to or after the suspending process utilizing a separate etch that selectively removes the patterned hard mask.

In some embodiments of the present disclosure, the portion of the buried oxide layer 14 located beneath each of the semiconductor nanowires 18 can be removed utilizing an isotropic etching process. The lateral component of the etch undercuts beneath each semiconductor nanowire 18. The etch however does not release the first semiconductor pad region 20A and the second semiconductor pad region 20B from the uppermost surface of the buried oxide layer 14. Instead, the first semiconductor pad region 20A and the second semiconductor pad region 20B remain attached to remaining first and second buried oxide layer portions 14L and 14R, respectively. In one embodiment of the present disclosure, the isotropic etching may, for example, be performed using dilute hydrofluoric acid (DHF). By "dilute hydrofluoric acid" it is meant that HF is mixed with water $H_2O$ to achieve a lower concentration (dilution) of the acid. In one embodiment, a 100:1 DHF etches approximately 2 to 3 nm of a buried oxide layer per minute at room temperature. In another embodiment, and instead of using a DHF etch, the suspension of the semiconductor nanowires 18 may also be obtained by performing an anneal can be conducted in an inert gas or hydrogen gas.

In accordance with the present disclosure, the underlying buried boron nitride layer 12, which is resistant to the etch used in suspending each semiconductor nanowire, serves as a vertical etch stop layer. Using a practical recess etch duration to release the semiconductor nanowires, the maximum recessed depth, $d_{max}$, that can be achieved in the present disclosure will be exactly equal to the thickness of the original buried oxide layer 14 regardless of the width of each semiconductor nanowire.

Figure 5A:
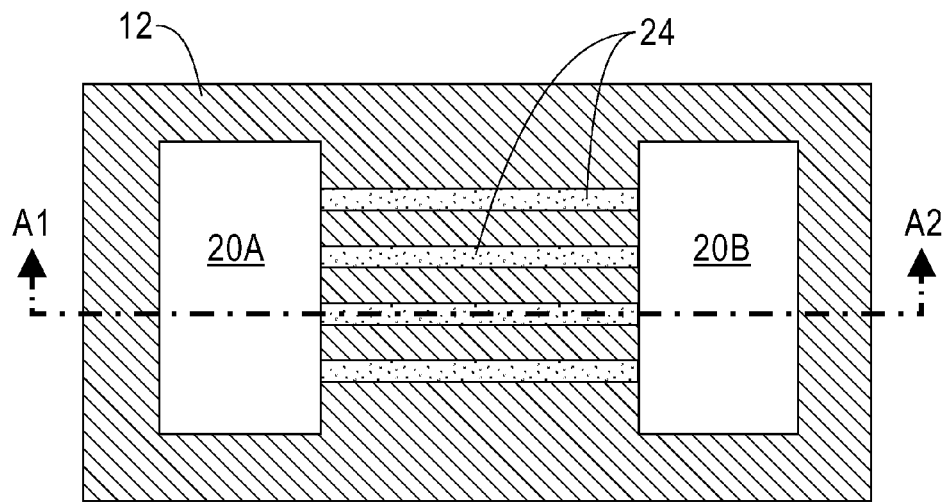
FIG. 5A is a top-down view of the exemplary semiconductor structure of FIG. 4A after thinning and reshaping each of the suspended semiconductor nanowires of the plurality of suspended semiconductor nanowires according to an embodiment of the present disclosure.
Figure 5B:
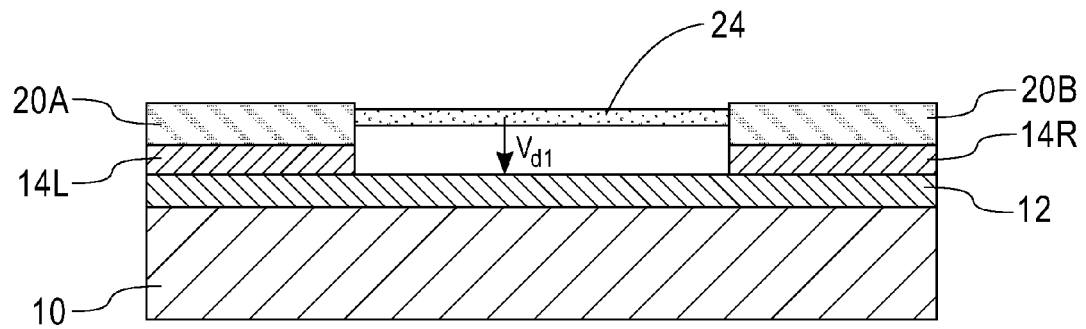
FIG. 5B is a vertical cross-sectional view of the exemplary semiconductor structure along the plane A1-A2 in FIG. 5A.

Referring now to FIGS. 5A-5B, there are illustrated the exemplary semiconductor structure of FIGS. 4A-B after thinning and reshaping each of the suspended semiconductor nanowires 18'. In accordance with the present disclosure, an annealing process can be used to thin and reshape the suspended nanowires 18'. The thinned and reshaped semiconductor nanowires (hereinafter referred to as semiconductor nanowire bodies) are now labeled as element 24 in the drawings of the present disclosure. During the annealing process, the exemplary structure shown in FIGS. 4A-4B is contacted with a inert gas or hydrogen at a temperature, pressure and for a duration sufficient to cause semiconductor atoms such as Si to migrate from the suspended nanowires 18' to the first and second semiconductor pads (20A, 20B). The term "inert gas" refers to a gas that does not react with the semiconductor atoms, i.e., Si. Exemplary used gases include, but are not limited to, xenon (Xe), helium (He), hydrogen and mixtures thereof. A content of oxygen ($O_2$) or water ($H_2O$) in the inert gas is typically very small and can be further reduced (to part per billion levels) by the use of gas purifiers. While the presence of $O_2$ or $H_2O$ is typically viewed as undesirable, it actually provides a way for controlling the rate of the re-distribution of the semiconductor atoms. The rate is controlled by a total pressure of the inert gas in contact with the wafer. Additionally, gas phase reactions between the inert gas and $O_2$ can affect the rate of the re-distribution of semiconductor atoms.

In one embodiment, the annealing used to thin and reshape the suspended semiconductor nanowires 18' includes a hydrogen ($H_2$) anneal. Although a $H_2$ anneal is now being described and illustrated, other inert gases can be used in a similar manner. In some embodiments and shortly before the $H_2$ annealing, any native oxide is etched off sidewalls of the suspended semiconductor nanowires 18' as well as the first and second semiconductor pads 20A, 20B.

Annealing in $H_2$ has several goals; see, for example, U.S. Pat. No. 7,884,004, the entire content of which is incorporated herein by reference. First, the $H_2$ anneal aids in smoothing the sidewalls of each suspended semiconductor nanowire 18'. Second, the $H_2$ anneal realigns the sidewalls of each suspended semiconductor nanowire 18' and the first and second semiconductor pads 20A, 20B to the crystal planes. Crystal planes are a mathematical/physical concept used to explain diffraction from crystals. Crystal planes are described, for example, in Ashcroft and Mermin, Solid State Physics, chapter 4 (1976), the contents of which are incorporated by reference herein. Third, the $H_2$ anneal re-shapes each suspended semiconductor nanowire cross-section from a rectangular cross-section (as shown in FIG. 4A) to a more cylindrical cross-section. Fourth, the $H_2$ anneal thins the body of the suspended semiconductor nanowire (by re-distributing semiconductor atoms from the body of the suspended semiconductor nanowire to the pads, i.e., semiconductor atoms such as Si migrate during the $H_2$ anneal from the nanowires to the pads). As a result, post $H_2$ anneal, the semiconductor nanowires 24 will be thinner than the pads 20A, 20B.

According to an exemplary embodiment, the inert gas anneal is performed with a gas pressure of from 30 ton to 1000 ton, at a temperature of from 600 degrees Celsius (° C.) to 1100° C. and for a duration of from about one minute to about 120 minutes. In general, the rate of semiconductor atom re-distribution increases with temperature and decreases with an increase in pressure. As highlighted above, instead of using a DHF etch, the suspension of the semiconductor nanowires may also be obtained during the anneal since the re-shaping of the semiconductor nanowire cross-section and migration of semiconductor atoms to the first and second semiconductor pads leads to release/separation of the semiconductor nanowire from the buried oxide layer.

The re-distribution/migration of semiconductor atoms achieves a selective mask-less process to thin down nanowires. By having connected pads, semiconductor atoms from the nanowires' high curvature surfaces migrate to the flat pads, which act as semiconductor atoms sinks.

At this point of the present disclosure, the thinned and reshaped surfaces of the semiconductor nanowire bodies 24 have a second roughness that is less than the first roughness. In one embodiment, the second roughness of the exposed surfaces of each semiconductor nanowire body 24, expressed in terms of a root mean squared roughness, is less than 0.5 nm. In another embodiment, the second roughness of the exposed surfaces of each semiconductor nanowire body 24, expressed in terms of a root mean squared roughness, is less than 0.7 nm. The pitch of one semiconductor nanowire body to its nearest neighboring semiconductor nanowire body remains within the range mentioned above for semiconductor nanowires 18.

In some embodiments, each semiconductor nanowire body 24 that was subjected to the above described anneal can be further thinned for additional critical dimension reduction. This further thinning step can be performed by first subjecting the entirety of semiconductor nanowire body 24 to a high temperature (greater than 700° C.) oxidation to grow a thermal oxide layer or alternatively a chemical oxide layer can be grown by a wet process. The oxide layer is then etched away. The oxidation and etching can be repeated on the entirety of each semiconductor nanowire body 24 to provide a desired critical dimension to each semiconductor nanowire body 24.

Because of the presence of the underlying buried boron nitride layer 12, the vertical distance, $V_{d1}$, between a central portion of each semiconductor nanowire body 24 to the substrate surface, i.e., the uppermost surface of the exposed portion of the buried boron nitride layer 12 remains constant even after performing further etching processes. The "central portion" of the semiconductor nanowire body can be defined as a region within the semiconductor nanowire body that is equal distance from the topmost surface of the semiconductor nanowire body to the bottommost surface of the semiconductor nanowire body. In some embodiments, $V_{d1}$ equals the original thickness of the buried oxide layer 14 plus half the thickness of the suspended semiconductor nanowires 18' removed from a bottommost surface upward. Typically, $V_{d1}$ is within a range from 3 nm to 50 nm, with a range from 5 nm to 25 nm being more typical.

Figure 6A:
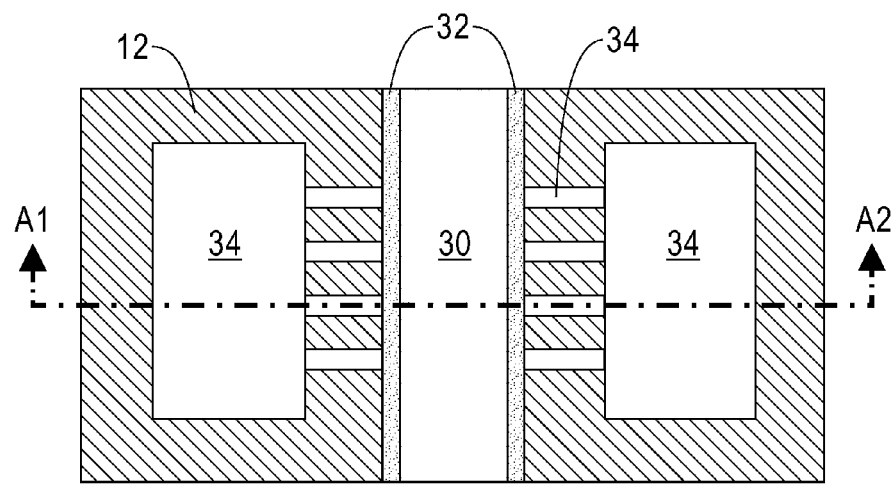
FIG. 6A is a top-down view of the exemplary semiconductor structure of FIG. 5A after formation of a gate-all around FET according to an embodiment of the present disclosure.
Figure 6B:
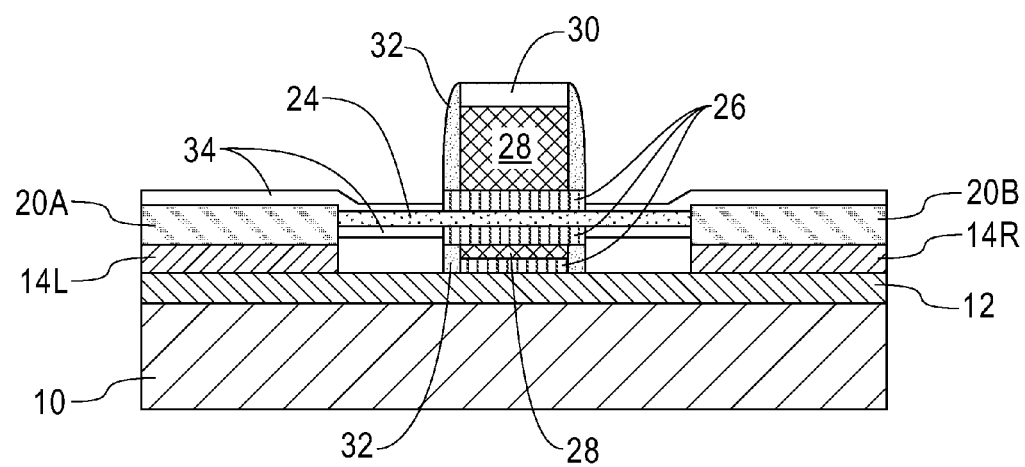
FIG. 6B is a vertical cross-sectional view of the exemplary semiconductor structure along the plane A1-A2 in FIG. 6A.

Referring now to FIGS. 6A-B, there are illustrated the exemplary semiconductor structure of FIGS. 5A-5B after formation of a gate-all around FET according to an embodiment of the present disclosure. The formation of the gate-all around FET includes forming a gate dielectric 26 on each of the semiconductor nanowire bodies 24 and the first and second semiconductor pads 20A, 20B. The gate dielectric 26 will also form on the exposed uppermost surface of the buried boron nitride layer 12. The gate dielectric 26 that forms on the exposed uppermost surface of the buried boron nitride layer 12 may be referred herein as a gate dielectric layer portion. The gate dielectric 26 can include, but is not limited to, silicon dioxide ($SiO_2$), silicon oxynitride (SiON), hafnium oxide ($HfO_2$) or any other suitable high-k dielectric(s). By "high-k dielectric" it is meant a dielectric metal oxide having a dielectric constant that is greater than the dielectric constant of silicon dioxide. The gate dielectric 26 may be deposited over first and second semiconductor pads 20A, 20B and around each semiconductor nanowire body 24 using, for example, chemical vapor deposition (CVD), atomic layer deposition (ALD) or an oxidation anneal in the case of $SiO_2$ and SiON.

A gate conductor is then blanket deposited over the substrate and patterned by lithography and etching to form gate 28. As an example, to fabricate a poly-Si gate, a poly-Si film is first blanket deposited over the device. Using lithography and selective RIE (e.g., hydrogen bromide (HBr)-based chemistry) the poly-Si film is selectively etched (except from where it is blocked by a gate cap 30) with respect to the gate dielectric 26. The RIE process typically includes two phases. In the first phase, the etching is directional (anisotropic) to obtain a straight profile for the gate line. In the second phase, the etching is rendered isotropic (for example by reducing the RIE bias) and the gate line is trimmed sideways by an amount sufficient to clear the gate material under the nanowire bodies in the regions outside the gate 28.

As illustrated in FIG. 6B, the gate 28 surrounds each semiconductor nanowire body 24. As can be clearly seen in FIG. 6A, the gate dielectric 26 also surrounds the semiconductor nanowire bodies 24. A gate cap 30, which may include any hard mask material such as, for example, silicon dioxide, silicon nitride or silicon oxynitride, is shown over gate 28 (the gate is not visible from this perspective as it is hidden by the gate cap). The gate cap 30 is formed as a blanket layer deposition, and then it is patterned during the step of patterning the gate 28.

FIGS. 6A-6B also illustrates the presence of spacers 32 which are present on sidewall surfaces of the gate 28 and atop an uppermost surface portion of the gate dielectric 26. The spacers 32 that can be employed in the present disclosure include an insulating nitride, oxide, oxynitride or multilayers thereof. The spacers 32 are formed by deposition and etching. Spacer material may remain under non-gated portions of the semiconductor nanowire bodies. As is shown in FIG. 6A, the spacers 32 are formed on opposite sides of the gate 28.

At this point of the present disclosure source/drain regions can be formed by selective epitaxy of a semiconductor material. Specifically, the formation of the source/drain regions includes: stripping of exposed portions of the gate dielectric and selective epitaxy is used to thicken portions of the semiconductor nanowire bodies 24 not covered by the gate/spacers and the first and second semiconductor pads 20A and 20B. The epitaxy can merge the nanowires into a continuous block of semiconductor material. The resulting epitaxial layer 34 can be of Si or a Si alloy such as SiGe. Growth methods can include ultra-high vacuum chemical vapor deposition (UHV-CVD), rapid thermal chemical vapor deposition (RT-CVD) and ALD. Typical Si precursors include, but are not limited to, dichlorosilane ($SiH_2Cl_2$), a mixture of silane ($SiH_4$) and hydrochloric acid (HCl), silicon tetrachloride ($SiCl_4$) and germane ($GeH_4$) for SiGe growth. The growth is selective in the sense that deposition of semiconductor takes place only over semiconductor surfaces, but not over dielectric surfaces such as oxides, silicon-nitrides, and boron nitride. While selective Si epitaxy typically requires growth temperatures of about 800° C., maintaining selectivity when using lower growth temperatures is possible by adding Ge to the epitaxial film. With pure Ge growth, the growth temperature can be as low as 300° C. Low temperature growth of SiGe is useful in the case of very thin nanowires as a way to circumvent agglomeration.

Self-aligned ion-implantation is then used to dope the source and drain regions. For n-type doping phosphorus (P) and arsenic (As) are most commonly used and for p-type doping boron (B), and indium (In) are typical. Rapid thermal annealing (RTA) is used to activate the dopants and anneal out implant damage. At this point in the process, distinct regions of the device become apparent. Namely, the portions of the semiconductor nanowire bodies 24 surrounded by the gate 28 become a channel region of the device, and the first and second semiconductor pads 20A and 20B and the exposed and, e.g., merged by epitaxy, portions of the semiconductor nanowire bodies 24 extending out from the gate adjacent to the pads become source and drain regions of the device.

Figure 7A:
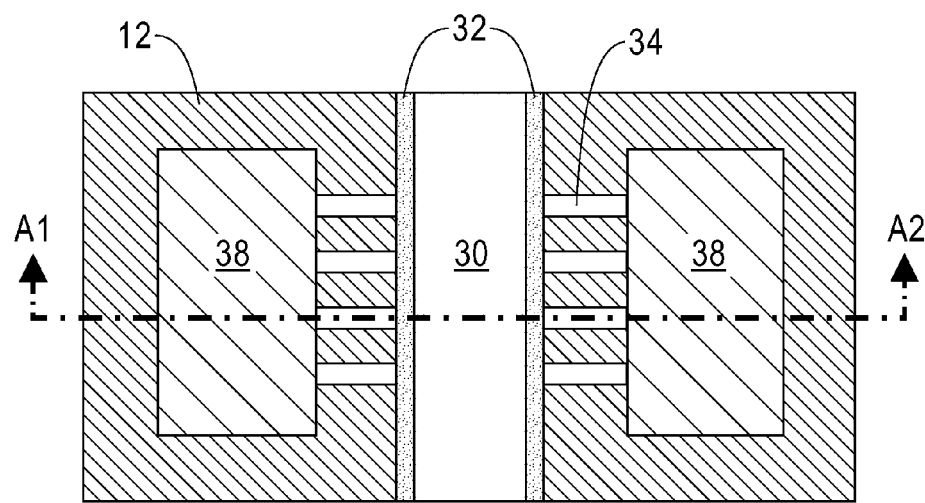
FIG. 7A is a top-down view of the exemplary semiconductor structure of FIG. 6A after formation of self-aligned silicide contacts according to an embodiment of the present disclosure.
Figure 7B:
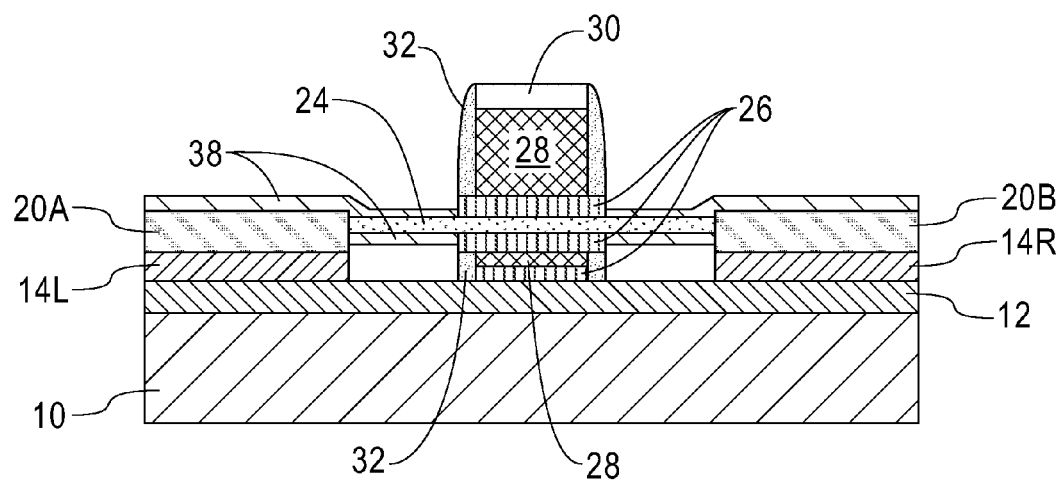
FIG. 7B is a vertical cross-sectional view of the exemplary semiconductor structure along the plane A1-A2 in FIG. 7A.

Referring now to FIGS. 7A-7B, there are illustrated the structure of FIGS. 6A-6B after formation of self-aligned silicide contacts according to an embodiment of the present disclosure. Specifically, self-aligned silicide contacts 38 are formed over the source and drain regions (and the gate if a poly-Si gate is used). More specifically, a metal such as nickel (Ni), platinum (Pt), cobalt (Co) and/or titanium (Ti) is blanket deposited over the device. The structure including the metal is annealed to allow the metal to react with the exposed semiconductor material over the source, drain and gate regions. The metal over non-semiconductor surfaces (e.g., the metal over spacers 32) remains unreacted. A selective etch is then used to remove the unreacted metal, leaving silicide contacts 38 over the source, drain and gate surfaces. As an example, in the case where Ni is used, the lower resistivity silicide phase is nickel-silicon (NiSi). The NiSi phase forms at an annealing temperature of about 420° C., and the etch chemistry used to remove the unreacted metal can be hydrogen peroxide:sulfuric acid ($H_2O_2:H_2SO_4$) 10:1 at 65° C. for 10 minutes.

Figure 8A:
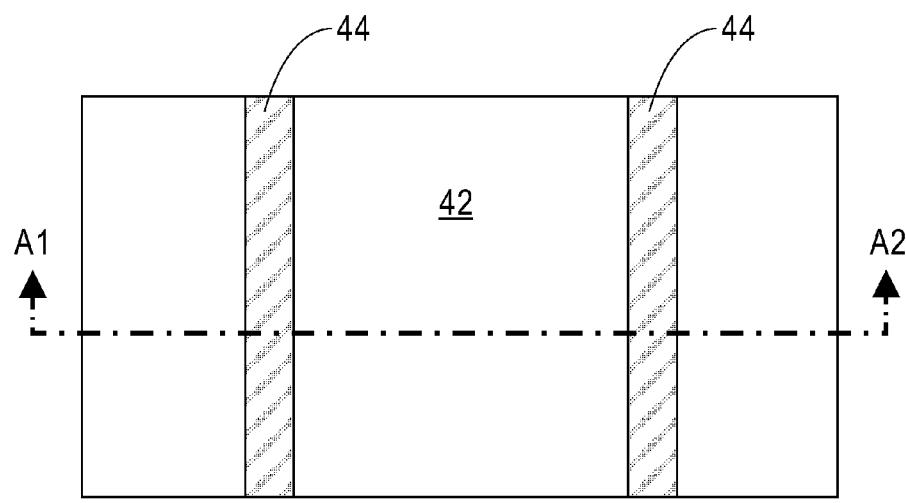
FIG. 8A is a top-down view of the exemplary semiconductor structure of FIG. 7A after formation of a contact level structure according to an embodiment of the present disclosure.
Figure 8B:
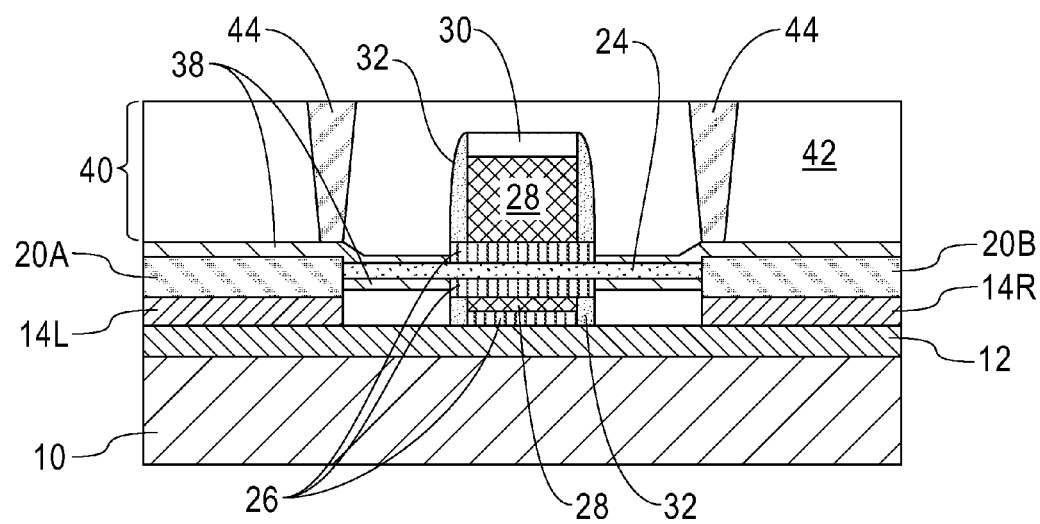
FIG. 8B is a vertical cross-sectional view of the exemplary semiconductor structure along the plane A1-A2 in FIG. 7A.

Referring now to FIGS. 8A-8B, there are shown the structure of FIGS. 7A-7B, after formation of a contact level structure 40. As shown, the contact level structure 40 includes a dielectric material 42 and a metal filled via 44. The contact level structure 40 can be formed by first depositing a blanket layer of dielectric material over the structure shown in FIGS. 7A-7B. The dielectric material 42 can be, for example, silicon oxide, an undoped or doped silicate glass, or a C-doped oxide including atoms of Si, C, O and H. The blanket layer of dielectric material can be formed utilizing a deposition process such as, for example, spin-on coating, chemical vapor deposition or plasma enhanced chemical vapor deposition. Next, via openings are formed into the blanket layer of dielectric material by photolithography and etching. The etching step exposes a portion of the uppermost surface of the silicide contacts 38 that are located above the source/drain regions. A conductive metal such as, for example, W, Cu, Al, or alloys thereof, is then formed into each of the via openings forming metal filled via 44. Any know deposition process including for example, plating, or sputtering can be used to fill each of the via openings with a metal. A planarization process such as, for example, chemical mechanical planarization can be used to form the planar structure shown in FIGS. 8A-8B.

The processing described above, provides a semiconductor device which includes a first buried oxide layer portion 14L and a second buried oxide layer portion 14R each located on an uppermost surface of a buried boron nitride layer 12, wherein a portion of the uppermost surface of the buried boron nitride layer 12 between the first and second buried oxide layer portions (14L, 14R) is exposed. The buried boron nitride layer 12 remains as a contiguous layer and the uppermost surface of the entirety of the buried boron nitride layer 12 remains planar. The device further includes a first semiconductor pad 20A located atop the first buried oxide layer portion 14L, and a second semiconductor pad 20B located atop the second buried oxide layer portion 14R. A plurality of semiconductor nanowires (i.e., semiconductor bodies 24) is also present connecting the first semiconductor pad 20A and the second semiconductor pad 20B in a ladder-like configuration and suspended above the exposed portion of the uppermost surface of the buried boron nitride layer 12.

The semiconductor device may also include a gate 28 of a field effect transistor surrounding each semiconductor nanowire (i.e., semiconductor bodies 24). The field effect transistor may further include a gate dielectric 26 surrounding each semiconductor nanowire (i.e., semiconductor bodies 24) and positioned between the gate 28 and a surface of the semiconductor nanowires.

A vertical distance, $V_{d1}$, is present between the center (i.e., central portion) of each semiconductor nanowire and the uppermost surface of the exposed portion of the buried boron nitride layer 12. The vertical distance remains constant no matter the number of different etching processes employed, or the dimension of each semiconductor nanowire that is formed. In accordance with the present disclosure, a vertical distance between a central portion of each semiconductor nanowire and the uppermost surface under each semiconductor nanowire is no larger than the vertical distance between the central portion of each semiconductor nanowire and the uppermost surface of the boron nitride layer.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a first buried oxide layer portion and a second buried oxide layer portion each located on an uppermost surface of a buried boron nitride layer, wherein a portion of said uppermost surface of said buried boron nitride layer between said first and second buried oxide layer portions is exposed;
   a first semiconductor pad located atop said first buried oxide layer portion;
   a second semiconductor pad located atop said second buried oxide layer portion;
   a plurality of semiconductor nanowires connecting the first semiconductor pad and the second semiconductor pad in a ladder-configuration and suspended above said exposed portion of said uppermost surface of said buried boron nitride layer;
   a gate dielectric surrounding each semiconductor nanowire and located directly on a top surface and a bottom surface of each semiconductor nanowire;
   a gate surrounding each semiconductor nanowire and located directly on a surface of each gate dielectric; and
   a gate dielectric portion located directly on a surface of said exposed portion of said buried boron nitride layer, and in contact with a surface of said gate located beneath each semiconductor nanowire.

2. The semiconductor device of claim 1, wherein a vertical distance between a central portion of each semiconductor nanowire and said uppermost surface of the exposed portion of said buried boron nitride layer is constant.

3. The semiconductor device of claim 1, wherein a vertical distance between a central portion of each semiconductor nanowire and said uppermost surface under each semiconductor nanowire is no larger than the vertical distance between the central portion of each semiconductor nanowire and the uppermost surface of the boron nitride layer.

4. The semiconductor device of claim 1, wherein said first semiconductor pad, said second semiconductor pad, and said semiconductor nanowires are each comprised of silicon.

5. The semiconductor device of claim 1, wherein a bottommost surface of said buried boron nitride layer is in direct contact with an uppermost surface of a handle substrate.

6. The semiconductor device of claim 1, wherein a bottommost surface of said buried boron nitride layer is in direct contact with an uppermost surface of another buried oxide layer.

7. The semiconductor device of claim 6, wherein said another buried oxide layer is contiguous and is located on an uppermost surface of a handle substrate.

8. The semiconductor device of claim 1, wherein said buried boron nitride layer is contiguous and has a planar uppermost surface spanning the entirety of the semiconductor device.

9. The semiconductor device of claim 1, wherein said buried boron nitride layer comprises amorphous boron nitride or amorphous hydrogenated boron nitride.

10. The semiconductor device of claim 1, wherein said buried boron nitride layer comprises hexagonal boron nitride or cubic boron nitride.

11. The semiconductor device of claim 1, wherein said gate dielectric portion has vertical edges that are in contact with a portion of a vertical edge of a spacer, said spacer is located on vertical sidewalls of said gate dielectric and said gate.

12. The semiconductor device of claim 1, wherein said gate dielectric portion has vertical edges that are not vertically aligned, or extend beyond, vertical edges of said gate dielectric.

13. The semiconductor device of claim 1, wherein said gate dielectric and said gate dielectric portion comprise a same dielectric material.

14. The semiconductor device of claim 13, wherein said same dielectric material is a dielectric having a dielectric constant of greater than silicon oxide.

* * * * *